(12) United States Patent
Chen et al.

(10) Patent No.: US 7,474,531 B2
(45) Date of Patent: Jan. 6, 2009

(54) CIRCUIT BOARD TESTING JIG

(75) Inventors: Chien-Cheng Chen, Taipei (TW); I-Wei Shen, Taipei (TW)

(73) Assignee: Inventec Corporation, Taipei (TW)

( * ) Notice: Subject to any disclaimer, the term of this patent is extended or adjusted under 35 U.S.C. 154(b) by 16 days.

(21) Appl. No.: 11/709,221

(22) Filed: Feb. 22, 2007

(65) Prior Publication Data
US 2008/0205005 A1 Aug. 28, 2008

(51) Int. Cl.
*H05K 7/20* (2006.01)
*H05K 5/00* (2006.01)
*G01R 31/02* (2006.01)

(52) U.S. Cl. ............... 361/719; 361/709; 361/755; 361/756; 324/754; 324/755

(58) Field of Classification Search ............ 361/719, 361/709, 755–756; 324/754–755
See application file for complete search history.

(56) References Cited

U.S. PATENT DOCUMENTS

| | | | | |
|---|---|---|---|---|
| 4,889,242 A | * | 12/1989 | Willberg et al. | 209/573 |
| 4,961,050 A | * | 10/1990 | Harwood et al. | 324/755 |
| 5,254,839 A | * | 10/1993 | Laine | 219/494 |
| 5,646,447 A | * | 7/1997 | Ramsey et al. | 257/727 |
| 5,923,181 A | * | 7/1999 | Beilstein et al. | 324/758 |
| 6,325,662 B1 | * | 12/2001 | Tustaniwskyj | 439/482 |
| 6,527,437 B1 | * | 3/2003 | Koh et al. | 374/1 |
| 6,909,299 B1 | * | 6/2005 | Siade et al. | 324/755 |
| 2002/0075024 A1 | * | 6/2002 | Fredeman et al. | 324/760 |
| 2002/0196598 A1 | * | 12/2002 | Momenpour et al. | 361/679 |
| 2003/0132770 A1 | * | 7/2003 | Conroy | 324/755 |
| 2004/0113646 A1 | * | 6/2004 | Yamashita | 324/760 |
| 2004/0124846 A1 | * | 7/2004 | Yamashita et al. | 324/537 |
| 2006/0290367 A1 | * | 12/2006 | Hobbs et al. | 324/763 |
| 2007/0145992 A1 | * | 6/2007 | Akahori et al. | 324/755 |

FOREIGN PATENT DOCUMENTS

TW M268578 6/2005

* cited by examiner

*Primary Examiner*—Jayprakash N Gandhi
*Assistant Examiner*—Bradley H Thomas
(74) *Attorney, Agent, or Firm*—Rabin & Berdo, P.C.

(57) ABSTRACT

A circuit board testing jig for testing a circuit board and dissipating heats generated by a heat-generating electronic element of the circuit board is provided. The circuit board testing jig includes a fixing frame, a platform, and a displacement mechanism. The fixing frame and the platform are respectively used to support the circuit board and a heatsink module. The displacement mechanism enables the platform to move between a ready position and an attached position. When the platform is located at the ready position, the heatsink module on the platform is separated from the heat-generating electronic element; when the platform is located at the attached position, the heatsink module is pressed onto the heat-generating electronic element, for dissipating the heat generated by the heat-generating electronic element.

9 Claims, 5 Drawing Sheets

CIRCUIT BOARD TESTING JIG

BACKGROUND OF THE INVENTION

1. Field of Invention

The present invention relates to a circuit board testing jig, and more particularly, to a testing jig that is gradually attached to a central processing unit (CPU) chip.

2. Related Art

Generally, current mainboards must be tested after being assembled, so as to determine whether the mainboards are qualified or not. Accordingly, a testing jig is designed to fix a mainboard to be tested, so as to perform relevant tests. Moreover, a heatsink module body of the mainboard to be tested is also assembled and attached to a CPU chip of the mainboard to be tested, so as to perform the heat dissipation test. However, at this time, as various models of mainboards require different heatsink modules, the shape and size of the heatsink module for each model are different, which is disadvantageous for the tests.

In addition, when designers and manufactures ship different heatsink modules, and the CPU chips of the products do not need to be shipped together with the computer mainframes, testers must dismantle the heatsink modules originally fixed on the CPU chips, which causes wastes of labor force, and the assembling and detaching process will cause the damage to the threaded teeth for fixing. Moreover, when performing the testing operation, the heatsink module is placed on bakelite, and the mainboard to be tested is manually moved downwards to the direction of the heatsink module, such that the CPU chip of the mainboard to be tested is closely pressed onto the heatsink module. However, in this process, the CPU chip is directly attached to the heatsink module with the front surface, which often causes uneven forces to be applied on the CPU chip, and thus causing damages to the CPU chip, and the tests cannot be continued.

Furthermore, Taiwan Patent Publication No. M268578 (briefly referred as Patent 578 hereinafter) discloses a universal heatsink module testing jig. In Patent 578, it is designed to dispose a fixing frame thereon, and a heatsink module is disposed on the fixing frame. In addition, the fixing frame is pivoted on the testing jig through two hinges. When a mainboard to be tested is placed on the testing jig, the fixing frame rotates towards the position of the CPU chip, and it is pressed onto the CPU chip, so as to dissipate the heat generated by the CPU chip on the mainboard to be tested, thereby preventing over heat of the CPU chip during the testing process. As the fixing frame is rotatably disposed on the testing jig, that is, the heatsink module on the fixing frame is rotatably pressed onto the CPU chip, the heatsink module often first crashes with the die of the CPU chip at a single point during the pressing, and then, it is gradually pressed onto the CPU chip with the rotation of the fixing frame. The fixing frame is not pressed along the normal direction of the CPU chip, so the CPU chip may also be damaged due to uneven forces applied thereon.

SUMMARY OF THE INVENTION

According to the above conventional art, the CPU chip of the mainboard to be tested directly moves towards the heatsink module on the testing jig, so as to be attached to the heatsink module with the front surface. The conventional testing jig does not have a guiding mechanism, and thus causing damage to the CPU chip. If the heatsink module is rotatably pressed onto the CPU chip, the heatsink module first crashes the die of the CPU chip at a single point, which damages the CPU chip due to an uneven force applied thereon. Accordingly, the present invention provides a circuit board testing jig to solve the aforementioned problems.

To achieve the aforementioned object, the present invention provides a circuit board testing jig for testing a circuit board and dissipating heat generated by a heat-generating electronic element of the circuit board. The circuit board testing jig includes a fixing frame, a platform, and a displacement mechanism. The fixing frame is used to support the circuit board and the platform is used to support a heatsink module. The displacement mechanism enables the platform to move between a ready position and an attached position. When the platform is located at the ready position, the heatsink module is separated from the heat-generating electronic element; when the platform is located at the attached position, the heat-dissipation module is pressed onto the heat-generating electronic element, for dissipating heat generated by the heat-generating electronic element.

The effect of the present invention lies in that, the heatsink module is gradually guided by the displacement mechanism to move upwards to the CPU chip in a direction for attaching with the front surface, such that the heatsink module approaches and is pressed onto the CPU chip along a path perpendicular to a surface of the CPU chip. Thus, the heatsink module is pressed onto the CPU chip with the front surface, and the heatsink module will not crash the CPU chip directly or at a single point, and thus, the damage caused by uneven forces applied on the CPU chip is avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

To make the objectives, structures, features, and functions of the present invention be more comprehensible, the present invention is illustrated below in detail through the embodiments.

Figure 1:
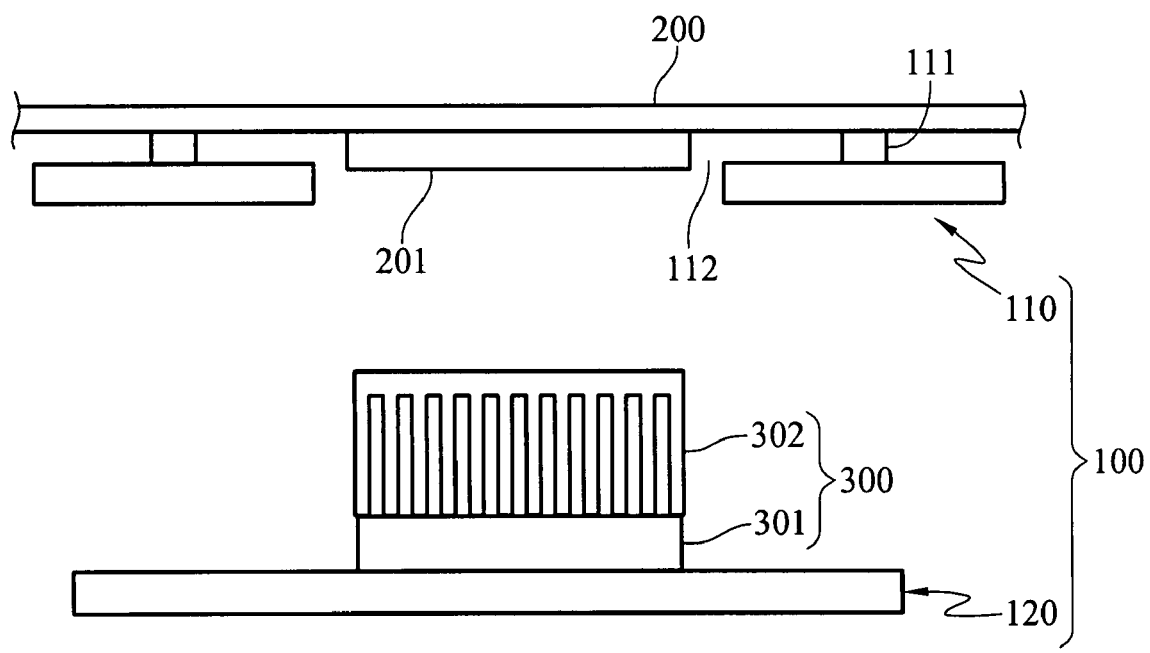
FIG. 1 shows an appearance of a first embodiment of the present invention.
Figure 2:
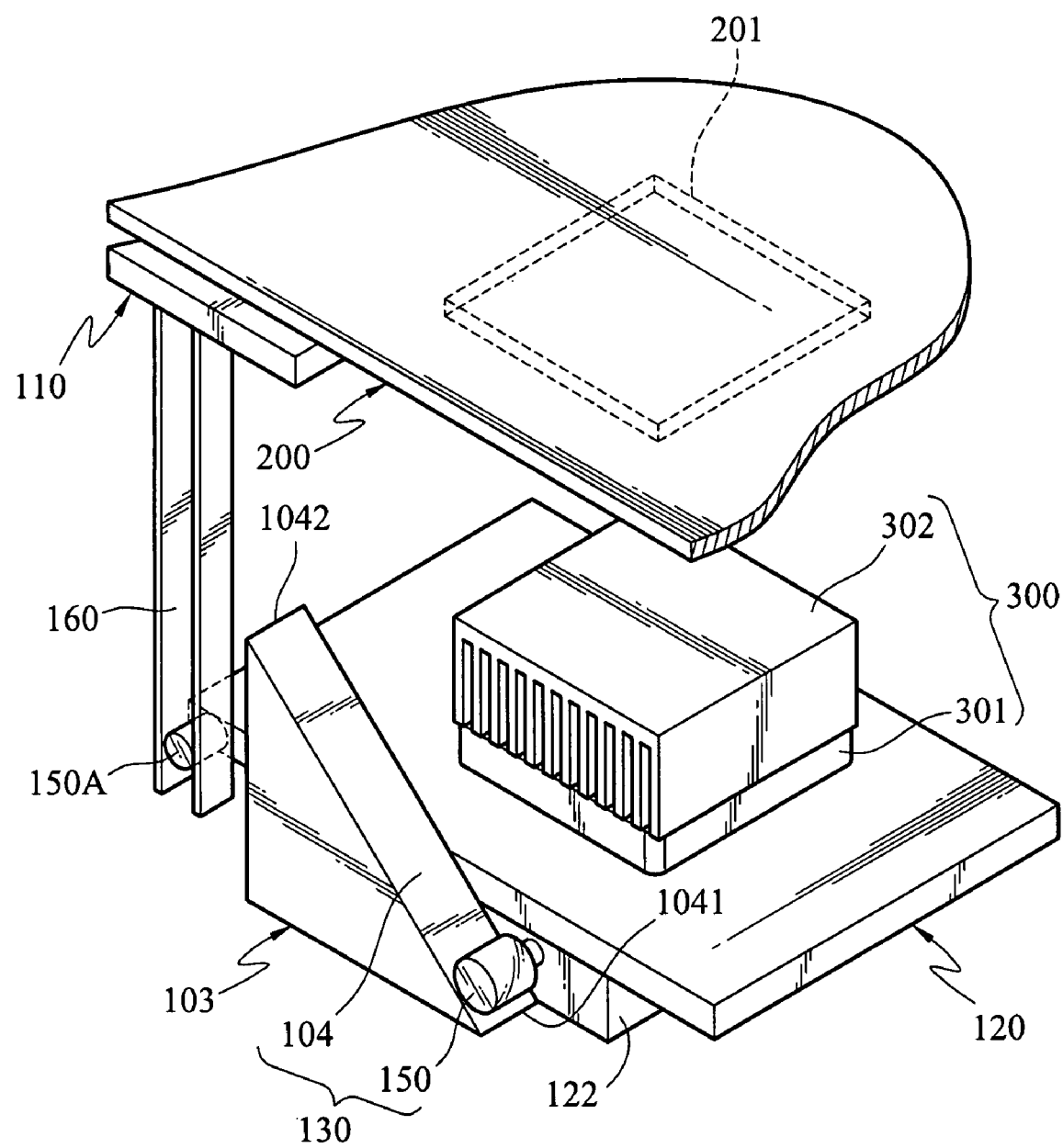
FIG. 2 is a schematic structural view of a fixing platform and a base of the jig according to the first embodiment of the present invention.

Referring to FIGS. 1 and 2, a circuit board testing jig 100 of the present invention is used for testing a circuit board 200. The circuit board 200 includes a plurality of electronic components and heat-generating electronic elements, and the circuit board testing jig 100 of the present invention can dissipate heat generated by the heat-generating electronic elements on the circuit board 200. The heat-generating electronic elements, for example, are central processing unit (CPU) chips, graphic chips, system chipsets, or another type of integrated circuit (IC) chips. Herein, a CPU chip 201 is used as the heat-generating electronic element for the application of the present invention.

The circuit board testing jig 100 of the present invention includes a fixing frame 110, a platform 120, and a displacement mechanism 130. The fixing frame 110 has a plurality of support posts 111 for supporting the circuit board 200. The fixing frame 110 further has at least one opening 112 for exposing the CPU chip 201 of the circuit board 200 after the fixing frame 110 supports the circuit board 200. One side of the platform 120 facing to the CPU chip 201 supports the heatsink module 300, such that the heatsink module 300 is pressed to the CPU chip 201 to exchange heat with the CPU chip 201. The heatsink module 300 includes a heatsink fan 301 and the heatsink body 302. The heatsink fan 301 is disposed on the top surface of the heatsink body 302, for generating an air flow that is blown towards the heatsink body 302. Besides supporting the heatsink module 300, the platform 120 can also support a connection port testing module and a disk drive testing module, depending upon the testing requirements, so as to test connection ports of the circuit board 200 and the signal transmission state between a disk drive and the circuit board 200 respectively.

Figure 3A:
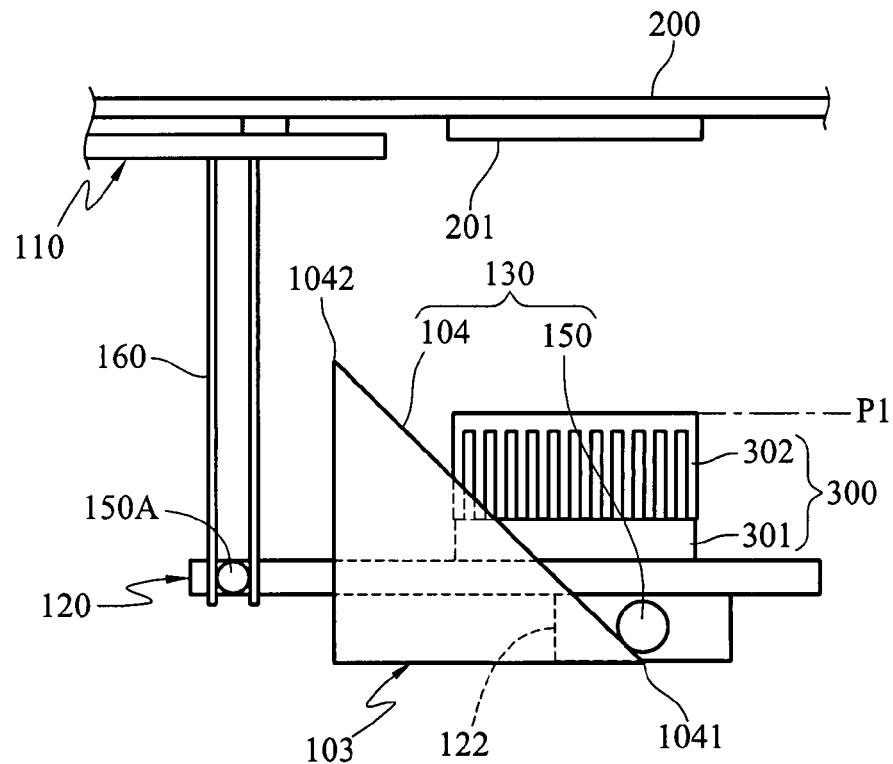
FIG. 3A is a schematic view of the platform located at the ready position according to the first embodiment of the present invention.
Figure 3B:
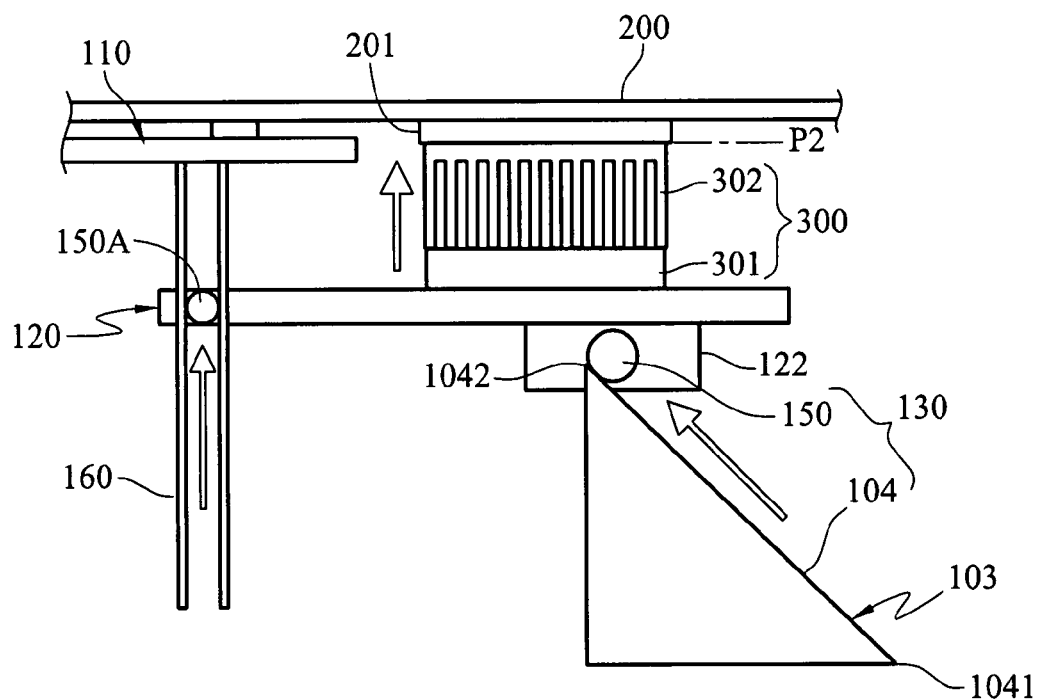
FIG. 3B is a schematic view of the platform located at the attached position according to the first embodiment of the present invention.

The displacement mechanism 130 includes at least one slope guide section 104 and at least one guide element 150, such that the platform 120 can move between a ready position P1 (as shown in FIG. 3A) and an attached position P2 (as shown in FIG. 3B), i.e., the platform 120 can move towards the fixing frame 110 or move away from the fixing frame 110, and thus, the heatsink model 300 can be attached to or separated from the CPU chip 201 of the circuit board 200. In addition, at least one guide base 103 is disposed at a position corresponding to the platform 120. However, the number of the guide base 103 is not limited to be one. For example, one guide base 103 can be disposed at a position corresponding to each side of the platform 120 respectively, and at this time, the number of the guide bases 103 is two. Furthermore, the guide base 103 is made of bakelite, but it is not limited to bakelite. Moreover, the slope guide section 104 is formed on the top surface of the guide base 103, and inclined towards the circuit board 200. The slope guide section 104 has a first end 1041 and a second end 1042 opposite to the first end 1041. Moreover, the tilt angle and height of the guide base 103 is designed in such a way that when the platform 120 is at the second end 1042, the heatsink body 302 of the heatsink module 300 is attached to the CPU chip 201 with a front surface, i.e., the heatsink module 300 is located at the attached position P2.

A sliding block 122 is extended from one side of the platform 120 opposite to the heatsink module 300, and the platform 120 slides on the slope guide section 104 of the guide base 103 through the sliding block 122, such that the platform 120 moves towards the fixing frame 110 or away from the fixing frame 110. However, at this time, the guide element 150 is connected to the sliding block 122, and a roller is taken as an example of the guide element 150 of the present invention herein. The platform 120 slides and moves on the slope guide section 104 through the guide element 150. In addition, as the platform 120 supports the heatsink module 300, the heatsink module 300 moves together with the platform 120, and thus, the relative distance between the heatsink module 300 and the CPU chip 201 varies as the movement of the platform 120.

In addition, a roller shaft 150A is disposed on the platform 120. The circuit board testing jig 100 further includes at least one platform rail 160 disposed at a position corresponding to the guide base 103. One end of the platform rail 160 is fixed on the fixing frame 110 for the roller shaft 150A to slide thereon. Meanwhile, the platform rail 160 is driven by the roller shaft 150A to move horizontally, so as to drive the fixing frame 110 to move horizontally in synchronization. The number of the platform rail 160 is not limited to that described above, and if the number of the guide bases 103 is two, the number of the platform rails 160 will be two accordingly.

Referring to FIGS. 3A, 3B, and 1, in actual applications, the circuit board 200 is placed on the support posts 111, so as to be positioned at a predetermined position of the fixing frame 110, such that the CPU chip 201 is exposed from the opening 112, and thus, the heatsink module 300 is pressed thereon. A tin foil for heat dissipation is attached on the bottom surface of the heatsink body 302. When the platform 120 supports the heatsink module 30, and the guide element 150 is located at the first end 1041 of the slope guide section 104, the roller shaft 150A is located at one end of the platform rail 160, the platform 120 is located at the ready position P1, the heatsink module 300 is paralleled to the CPU chip 201 and has a distance apart from the CPU chip 201, and the heatsink module 300 is separated from the CPU chip 201. When the guide element 150 gradually moves from the first end 1041 to the second end 1042 along the slope guide section 104, the platform 120 correspondingly moves along the top left direction in the figure, and as the movement of the roller shaft 150A is limited by the platform rail 160, the roller shaft 150A drives the platform rail 160, the fixing frame 110, and the circuit board 200 to move horizontally. The platform 120 and the fixing frame 110 are moved in synchronization, so the heatsink module 300 of the platform 120 approaches along a path for attaching with the front surface, in a direction perpendicular to the surface of the CPU chip 201 of the fixing frame 110.

When the guide element 150 is located at the second end 1042 of the slope guide section 104, and the roller shaft 150A is located at the other end of the platform rail 160, the platform 120 is located at the attached position P2, and the heatsink body 302 of the heatsink module 300 is attached to and covered on the CPU chip 201. Thus, the heatsink module 300 can dissipate the heat generated by the CPU chip 201.

Figure 4A:
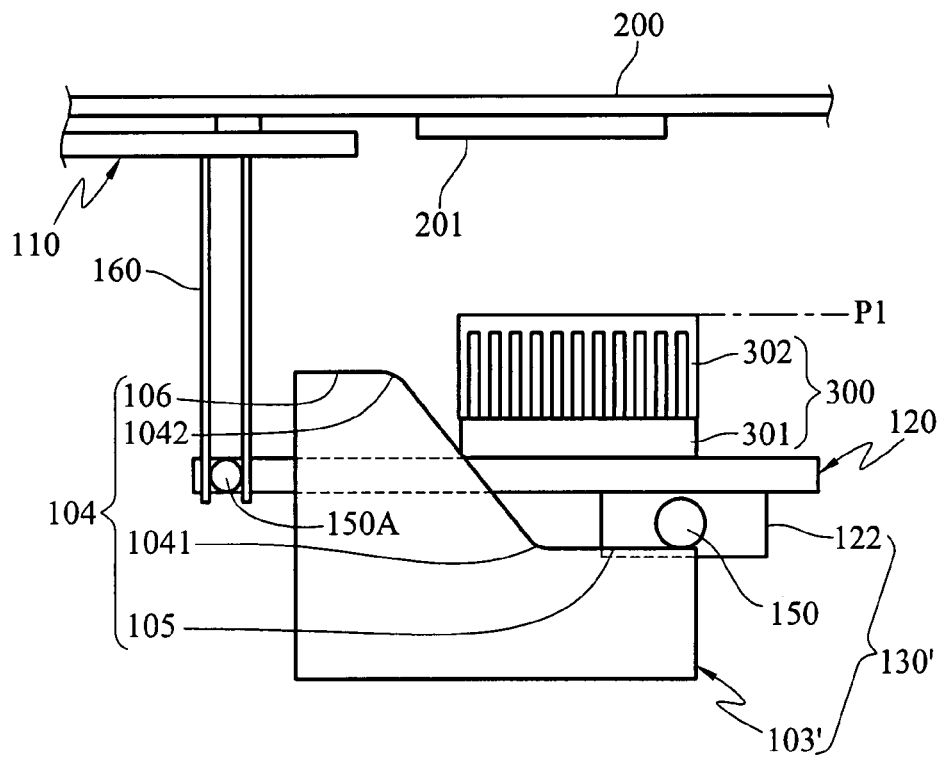
FIG. 4A is a schematic view of the platform located at the ready position according to a second embodiment of the present invention.
Figure 4B:
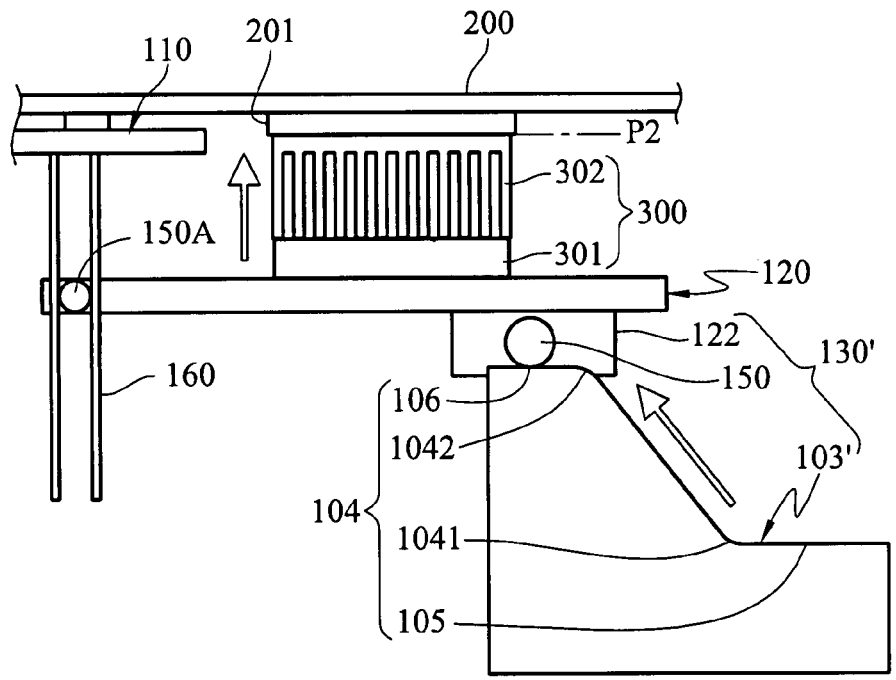
FIG. 4B is a schematic view of the platform located at the attached position according to the second embodiment of the present invention.

Referring to FIGS. 4A and 4B, a second embodiment of the present invention is shown, which has a structure substantially similar to that of the first embodiment. The difference between the two embodiments lies in that, the displacement mechanism 130' in the second embodiment is a linear cam, such that the platform 120 supporting the heatsink module 300 moves between the ready position P1 and the attached position P2. Herein, the linear cam uses a guide base 103' as an example, but which is not limited herein.

In addition to the first end 1041 and the second end 1042 formed in the slope guide section 104 on the top surface of the guide base 103', retaining sections 105 and 106 are respectively extended from the first end 1041 and the second end 1042 for retaining the roller shaft 150A. Similarly, the tilt angle and height of the guide base 103' are designed in such a way that when the platform 120 is at the second end 1042, the heatsink body 302 of the heatsink module 300 is attached to the CPU chip 201 with the front surface.

In actual applications, when the platform 120 supports the heatsink module 300, and the guide element 150 is located in the retaining section 105 of the guide base 103', the roller shaft 150A is located at one end of the platform rail 160, the platform 120 is located at the ready position P1, the heatsink module 300 is paralleled to the CPU chip 201 and has a distance apart from the CPU chip 201, and the heatsink module 300 is separated from the CPU chip 201.

When the guide element 150 enters to the slope guide section 104 and gradually moves towards the second end 1042, the platform 120 moves accordingly, and the roller shaft 150A also moves along the platform rail 160, so as to drive the platform rail 160 to move horizontally. Meanwhile, the platform rail 160 also drives the fixing frame 110 to move horizontally. As the platform 120 and the fixing frame 110 move in synchronization, the heatsink module 300 of the platform 120 is maintained at a direction for attaching with the front surface, and approaches along a path perpendicular to the surface of the CPU chip 201 of the fixing frame 110.

When the guide element 150 is located in the retaining section 106, and the roller shaft 150A is located at the other end of the platform rail 160, the platform 120 is located at the attached position P2, and the heatsink body 302 of the heatsink module 300 is attached to the CPU chip 201. Thus, the heatsink module 300 can dissipate the heat generated by the CPU chip 201.

Figure 5A:
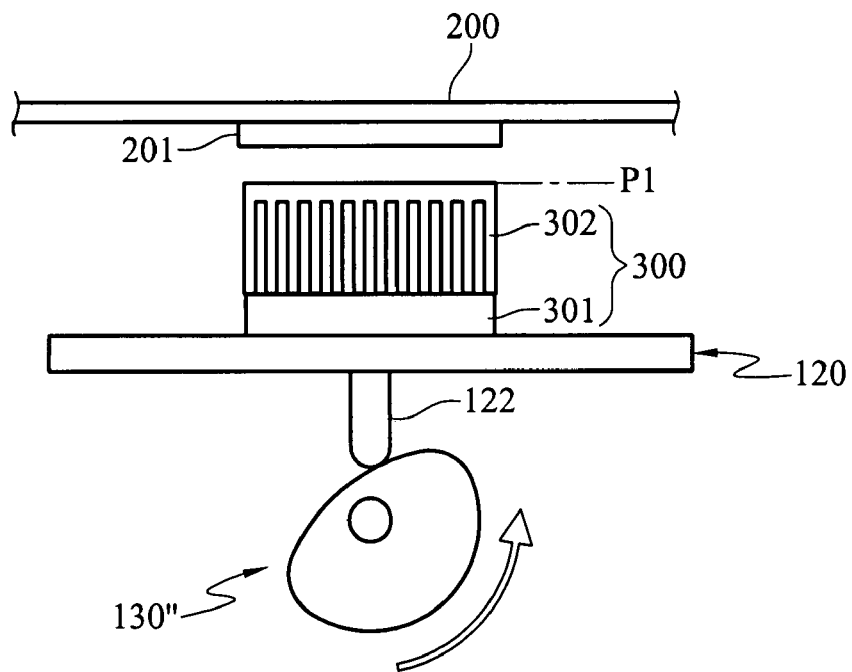
FIG. 5A is a schematic view of the platform located at the ready position according to a third embodiment of the present invention.
Figure 5B:
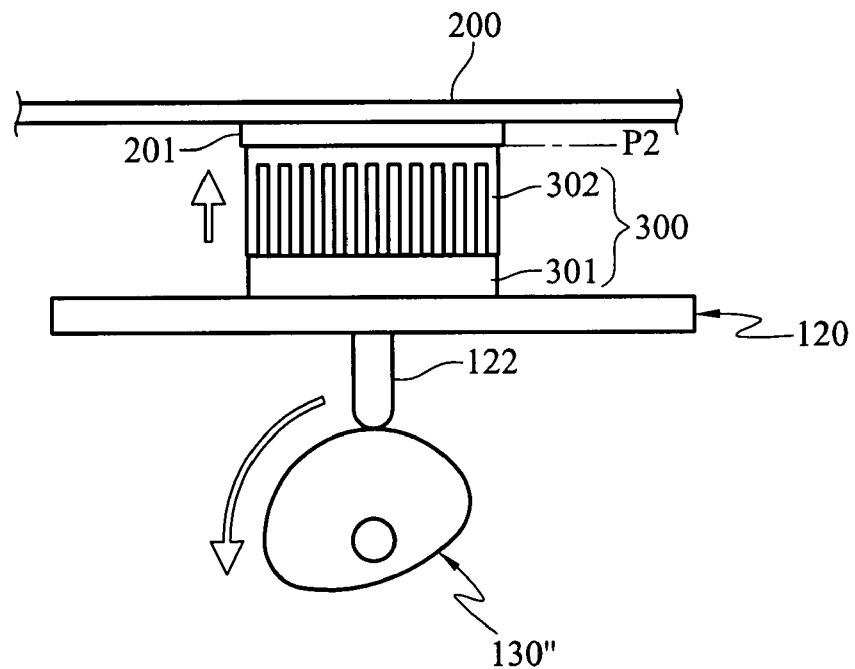
FIG. 5B is a schematic view of the platform located at the attached position according to the third embodiment of the present invention.

Referring to FIGS. 5A and 5B, a third embodiment of the present invention is shown. The displacement mechanism 130" of the third embodiment is a rotary cam that is defined as a component having a curved surface, which is rotated to drive another component, a follower, to provide a preset movement. Particularly, the platform 120 has a sliding block 122, and the surface of the sliding block 122 is attached to the circumferential part of the displacement mechanism 130". One end of the sliding block 122 for attaching to the displacement mechanism 130" is arc-shaped, such that the sliding block 122 can move as the rotation of the displacement mechanism 130".

As the displacement mechanism 130" rotates between a first angular position and a second angular position, the sliding block 122 is driven to move between the ready position P1 and the attached position P2 along the circumferential track of the displacement mechanism 130", and accordingly, the platform 120 also moves up and down. Therefore, when the displacement mechanism 130" is at the first angular position, the platform 120 is located at the ready position P1; when the displacement mechanism 130" is at the second angular position, the platform 120 is located at the attached position P2, so as to be attached on the CPU chip 201 for dissipating the heat generated by the CPU chip 201.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit board testing jig, applicable for testing a circuit board, and dissipating heat generated by a heat-generating electronic element of the circuit board, comprising:
    a fixing frame, for supporting the circuit board;
    a platform, for supporting a heatsink module, wherein the heatsink module is used for dissipating heat;
    a displacement mechanism, comprising at least one slope guide section and at least one guide element, for enabling the platform to move between a ready position and an attached position, the slope guide section having a first end and a second end opposite to the first end, the guide element being disposed on the platform, the guide element sliding on the slope guide section and driving the platform to move accordingly;
    wherein when the guide element is positioned at the first end, the platform is located at the ready position, such that the heatsink module is separated from the heat-generating electronic element; and
    wherein when the guide element is positioned at the second end, the platform is located at the attached position, the heatsink module is attached to the heat-generating electronic element for dissipating heat.

2. The circuit board testing jig as claimed in claim 1, wherein the heatsink module further comprises a heatsink body, and when the platform is located at the attached position, the heatsink body is attached onto the heat-generating electronic element, for dissipating heat generated by the heat-generating electronic element.

3. The circuit board testing jig as claimed in claim 2, wherein the heatsink module further comprises a heatsink fan for generating an air flow blown towards the heatsink body.

4. The circuit board testing jig as claimed in claim 1, further comprising at least one platform rail, for guiding a moving path for the platform, such that the heatsink module approaches and is attached to the heat-generating electronic element along a path perpendicular to a surface of the heat-generating element.

5. The circuit board testing jig as claimed in claim 1, wherein the guide element is a roller, and the platform slides on the slope guide section through the roller.

6. The circuit board testing jig as claimed in claim 1, wherein a retaining section is further extended from the first end and the second end respectively for retaining the guide element.

7. A circuit board testing jig, applicable for testing a circuit board, and dissipating heat generated by a heat-generating electronic element of the circuit board, comprising:
   a fixing frame, for supporting the circuit board;
   a platform, for supporting a heatsink module, wherein the heatsink module is used for dissipating heat;
   a sliding block extending from the platform; and
   a displacement mechanism, the displacement mechanism being a rotary cam attached to the sliding block; the rotary cam being rotatable between a first angular position and a second angular position for enabling the platform to move between a ready position and an attached position, wherein when the rotary cam is at the first angular position, the sliding block is driven to make the platform be located at the ready position, such that the heatsink module is separated from the heat-generating electronic element, and when the rotary cam is at the second angular position, the sliding block is driven to locate the platform at the attached position, such that the heatsink module is attached to the heat-generating electronic element for dissipating heat.

8. The circuit board testing jig as claimed in claim 7, wherein the heatsink module further comprises a heatsink body, and when the platform is located at the attached position, the heatsink body is attached onto the heat-generating electronic element, for dissipating heat generated by the heat-generating electronic element.

9. The circuit board testing jig as claimed in claim 8, wherein the heatsink module further comprises a heatsink fan for generating an air flow blown towards the heatsink body.

* * * * *